United States Patent [19]
Okabayashi et al.

[11] Patent Number: 4,558,507
[45] Date of Patent: Dec. 17, 1985

[54] METHOD OF MANUFACTURING SEMICONDUCTOR DEVICE

[75] Inventors: Hidekazu Okabayashi; Mitsutaka Morimoto; Eiji Nagasawa, all of Tokyo, Japan

[73] Assignee: NEC Corporation, Tokyo, Japan

[21] Appl. No.: 550,913

[22] Filed: Nov. 10, 1983

[30] Foreign Application Priority Data

Nov. 12, 1982 [JP] Japan .................................. 57-198570
Apr. 12, 1983 [JP] Japan .................................. 58-64085
Apr. 21, 1983 [JP] Japan .................................. 58-70488

[51] Int. Cl.$^4$ .................... H01L 29/78; H01L 21/225
[52] U.S. Cl. ......................................... 29/571; 29/578; 29/576 B; 29/589; 29/591; 148/1.5; 148/188; 148/DIG. 19; 148/DIG. 147; 357/67; 357/23.3; 357/59
[58] Field of Search .................... 29/571, 578, 576 B, 29/589, 591; 148/1.5, 186, 188, 189, DIG. 19, DIG. 147; 357/67, 23, 40, 59

[56] References Cited

U.S. PATENT DOCUMENTS

| | | | |
|---|---|---|---|
| 3,881,971 | 5/1975 | Greer et al. | 357/675 X |
| 3,887,993 | 6/1975 | Okada et al. | 29/571 |
| 4,259,680 | 3/1981 | Lepselter et al. | 357/675 X |
| 4,343,082 | 8/1982 | Lepselter et al. | 357/675 X |

FOREIGN PATENT DOCUMENTS 0111066  7/1982  Japan .................................. 357/675

OTHER PUBLICATIONS

Kircher et al., "Fabricating a Gate Field-Effect Transistor" IBM Tech. Disc. Bull., vol. 13, No. 3, Aug. 1970, pp. 646–648.

Chapman et al., "Silicide Formation by High-Dose Si+ ion Implantation of Pd" J. Appl. Phys. 50(10), Oct. 1970, 6321–6327.

Laibowitz et al., "Fabrication of Vias in a Multilayered Metallization in LSI Technology" IBM Tech. Disc. Bull., vol. 21, No. 12, May 1979, pp. 5051–5052.

Thin Films–Interdiffusion and Reactions, by Poate; Tu; Mayer; John Wiley & Sons Publisher.

Primary Examiner—Brian E. Hearn
Assistant Examiner—David A. Hey
Attorney, Agent, or Firm—Laff, Whitesel, Conte & Saret

[57] ABSTRACT

The present invention relates to a method of forming a diffused region with a shallow junction having a refractory metal silicide layer thereon. At first, the refractory metal silicide layer is selectively formed on a silicon substrate of one conductivity type. An insulating film is then formed at least on the refractory metal silicide layer, and a contact hole is opened on a part of the silicide layer. After necessary high temperature treatments have been conducted, a dopant impurity of the opposite conductivity type is introduced from the contact hole to the silicide layer. The impurity is laterally dispersed in the silicide layer and diffused into the whole portion of the silicon substrate in contact with the silicide layer, whereby the diffused region with a shallow junction can be formed.

11 Claims, 32 Drawing Figures

METHOD OF MANUFACTURING SEMICONDUCTOR DEVICE

BACKGROUND OF THE INVENTION

The present invention relates to a method of manufacturing a semiconductor device, and more particularly, to a method of manufacturing a shallowly diffused layer having a refractory metal silicide thereon.

A refractory metal silicide technology employs the refractory metal silicide such as a molybdenum silicide provided on deffused wiring layers in a silicon substrate or on source and drain regions of an insulated gate field effect transistor (hereinafter called as "IGFET"). It has been widely used in integrated circuits of silicon, because, it can reduce the resistance of the diffused wiring layers, etc. In this technology, metals having high-melting point such as mylybdenum, tungsten, titanium and so forth are employed as refractory metals.

However, in the prior art this technology, diffused regions such as source, drain regions cannot be shallowly formed. When the refractory metal silicide is formed, the dopant impurity of N or P type has already been introduced into the silicon substrate. Therefore, the dopant impurity is undesirably diffused deeply into the substrate by the heat treatment for formation of the metal silicide. For this reason, it is difficult to form a shallow region with a shallow PN junction, e.g., shallow source and drain regions in an IGFET or a shallow emitter region in a bipolar transistor. Moreover, since the dopant is undesirably diffused also by a subsequent heat treatment at 900° to 1000° C. for fluidizing phosphosilicate glass for an interlayer insulating film which is carried out to flatten the surface of the phosphosiliate glass film. Therefore, the fluidization of phosphosilicate glass cannot be performed, disadvantageously.

SUMMARY OF THE INVENTION

Accordingly, it is an object of the invention to provide a method of forming a shallow diffused region or layer having a refractory metal silicide provided on the surface thereof.

It is another object of the invention to provide a method of diffusing an impurity such as phosphorus, arsenic or boron into the semiconductor surface portion covered with an insulating film or the like.

It is still another object of the invention to provide a novel method of forming the shallow diffused layer having refractory metal silicide provided on the surface thereof by employing a wiring layer on a silicon substrate.

According to a primary feature of the invention, there is provided a method of manufacturing a semiconductor device comprising the steps of: forming a refractory metal silicide layer on a predetermined region of one major surface of a silicon substrate; providing an insulating film on the refractory metal silicide layer; forming an opening in the insulating film on a portion of the refractory metal silicide such that the surface of the refractory metal silicide is partially exposed or such that the insulating film on the refractory metal silicide is partially thinned; and introducing an impurity of P or N type through the opening and through the refractory metal silicide to diffuse the impurity in the part of the silicon substrate adjacent to the refractory metal silicide. In general, when the part of a silicon substrate having a refractory metal silicide thereon is of one conductivity type, an impurity to be introduced therein is of the other conductivity type. Thus, the impurity-diffused region forms a shallow PN junction with the silicon substrate. In addition, in forming the refractory metal silicide, it is favorable to carry out a heat treatment after inactive ions, such as silicon ions or argon ions, are implanted into the interface between a refractory metal and the silicon substrate for mixing the interface and thereby to obtain a high quality silicide by the heat treatment. This heat treatment is favorably carried out at 500° to 600° C. to form a refractory metal silicide. When the above-mentioned inactive ions have been implanted, the unreacted metal film on an insulating film is removed and then a heat treatment at a higher temperature, e.g. above 900° C., may be conducted to recover any crystal defect produced by the inactive ions. The higher temperature treatment can also fine the insulating film formed by CVD method. That is, the film can be made highly dense by employing this process. The opening in the insulating film through which the impurity is introduced can be employed as a contact hole. A metal wiring layer, e.g., aluminum, can be connected to the refractory metal silicide through the contact hole so as to be a lead electrode for the diffused region, for example, source and drain regions of an IGFET. Alternatively, as a wiring layer of polycrystalline electrically-conductive material such as polycrystalline molybdenum or polycrystalline silicon may be connected to the refractory metal silicide through the contact hole to introduce an impurity through the wiring layer of the polycrystalline electrically-conductive material to the silicide layer thereby to form a diffused region in the silicon substrate via the silicide layer. Further, the wiring layer of the polycrystalline electrically-conductive material may be formed to have what is called "multilayer wiring structure". In such a case, an impurity is introduced from the uppermost wiring layer. The process in which the impurity is introduced into the refractory metal silicide layer through the opening and horizontally moved in the silicide layer and then diffused into the silicon substrate from the silicide layer, can be accomplished in one step which is carried out at a temperature above 900° C. When it is desired to uniform the depth of the bottom surface of the diffused region in the silicon substrate, i.e., to flatten the bottom surface of the PN junction, however, an impurity is first introduced into the refractory metal silicide through the opening at a low temperature, below 800° C. In this step, the impurity is laterally diffused in the silicide layer and distributed substantially uniformly throughout the silicide layer but is not substantially diffused into the silicon substrate. Next, the introduction of the impurity through the opening is stopped and the substrate is heat-treated at a temperature above 900° C. in an inert gas atmosphere, e.g., a nitrogen atmosphere to diffuse the impurity into the silicon substrate from the refractory metal silicide by using the refractory metal silicide as an impurity source, thereby making it possible to form an impurity-diffused region having a depth which is substantially uniform.

The following is the description of a practical manufacturing method having the above-mentioned primary features of the invention.

According to one feature of the present invention, there is provided a method of manufacturing a semiconductor device comprising the steps of: forming a first insulating film on a silicon substrate, forming a first opening in the first insulating film to expose a predetermined region on the substrate surface, forming a refractory metal thin film on the surface of the silicon substrate within the first opening as well as on the first insulating film, implanting ions which are electrically inert in silicon crystal, e.g., silicon ions, into the vicinity of the interface between the refractory metal and the silicon surface thereby to mix the interfacial portion of the refractory metal and that of the silicon surface, reacting the refractory metal and the silicon substrate with each other within the first opening in the insulating film by a heat treatment at 500° to 600° C. thereby to form a refractory metal silicide within the first opening in a self-alignment manner, removing the unreacted portion of the refractory metal on the insulating film, forming a second insulating film on at least the refractory metal silicide, forming a second opening in the second insulating film so that a portion of the surface of the refractory metal silicide is exposed or a thin layer of the second insulating film is left on the portion of the surface of the refractory metal silicide, introducing a dopant impurity from the second opening into the refractory metal silicide layer, diffusing laterally the dopant impurity within the refractory metal silicide layer, and diffusing the dopant impurity in a part of the substrate adjacent and surrounding the refractory metal silicide layer by a heat treatment.

According to another aspect of the invention, there is provided a method of manufacturing a semiconductor device comprising the steps of: selectively forming a field insulating film on a silicon substrate; forming a refractory metal silicide layer on a predetermined portion in an element-forming region of the silicon substrate which is adjacent to the field insulating film; forming a wiring layer of a polycrystalline electrically-conductive material, e.g., polycrystalline molybdenum or polycrystalline silicon, which connects to the refractory metal silicide and extends on the field insulating film; forming an insulating layer so as to cover both the refractory metal silicide layer and the wiring layer; forming a contact hole in the insulating layer reaching the surface of a predetermined portion of the wiring layer on the field insulating film; and supplying impurities to the refractory metal silicide layer through the wiring layer from the contact hole, whereby the impurities move horizontally in the silicide layer and go into a part of the silicon substrate which is in contact with the refractory metal silicide layer and thereby an impurity-diffused region is formed around the refractory metal silicide layer in the substrate.

The wiring layer can be connected to an upper wiring layer extending on the insulating layer via the contact hole. In the case where the upper wiring layer is made of a polycrystalline electrically-conductive material, it is possible to provide another insulating layer thereon, to form a predetermined opening therein and to introduce the impurity therefrom to form the impurity-diffused layer in the silicon substrate. When such a multilayer wiring is required, it is only necessary to employ a polycrystalline electrically-conductive material to form these wiring layers constituting the multilayer wiring and to introduce an impurity from the opening in the insulating layer on the uppermost wiring layer to form the diffused layer in the silicon substrate. In such a case, moreover, the impurity may be diffused from the whole upper surface of the uppermost layer without providing any insulating layer on the uppermost wiring layer. In this case, the formation of the passivation film on the uppermost wiring layer should be effected at a low temperature in order to prevent the formed diffused layer from becoming deep in a subsequent step.

The diffused layer or region in the silicon substrate formed by the above various methods can be used as shallow junction source and drain regions of an IGFET. Also, the diffused layer can be used as a shallow junction emitter region of a bipolar transistor.

In general, the depth of the metal silicide layer from the silicon substrate surface, e.g., the channel region surface of an IGFET, is 0.05 to 0.2 $\mu$m, and the distance between the bottom or side surface of the metal silicide layer and the PN junction formed between the diffused region and the substrate is 0.05 to 0.2 $\mu$m.

The method in accordance with the invention utilizes the remarkable horizontal diffusion effect of the dopant within the refractory metal silicide layer formed on the silicon substrate surface. More specifically, according to the method of the invention, the layer of the refractory metal silicide formed on the silicon substrate is used as an impurity transporting lateral path. Therefore, while the impurity is laterally diffused or transported through the silicide layer, or after the impurity is diffused or transported therethrough, the impurity can be diffused from the silicide layer into the semiconductor region in contact therewith. It is well known from such a book as entitled "Thin Films-Interdiffusion and Reactions" (published by John Wiley & Sons, Inc. (New York) in 1978) compiled by J. M. Poate, K. N. Tu and J. W. Mayer, on pages 161 to 242 specially, on pages 162 to 163 and pages 227 to 231, that the diffusion coefficient of an impurity through the grain boundary of a polycrystalline substance is remarkably larger than that in a single crystal. However, it is completely novel that a refractory metal silicide layer on the major surface of a silicon substrate is employed as a path for laterally transporting an impurity and as a practical impurity source to diffuse the impurity into the silicon substrate thereby to form an impurity region. It is also novel that a wiring layer made of a polycrystalline electrically-conductive material is connected to a refractory metal silicide layer and an impurity is introduced into the refractory metal silicide layer from the wiring layer and is then diffused into a silicon substrate. Although such a technique is shown in the specification of U.S. Pat. No. 3,477,886 that a silicon dioxide layer is employed as a path for horizontally transporting gallium and indium, it is clear that the silicon dioxide layer and the refractory metal silicide layer are substances completely different from each other.

DESCRIPTION OF THE PREFERRED EMBODIMENTS

FIGS. 1 and 2 schematically show the fundamental features of the method in accordance with the invention.

Figure 1A:
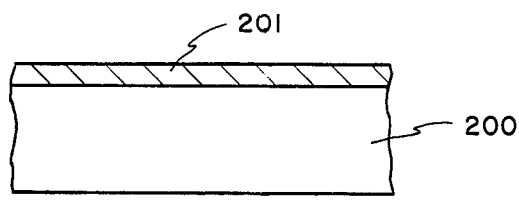
FIGS. 1A to 1C and FIGS. 2A to 2C are cross-sectional views showing the fundamental features of the method in accordance with the invention.
Figure 1B:
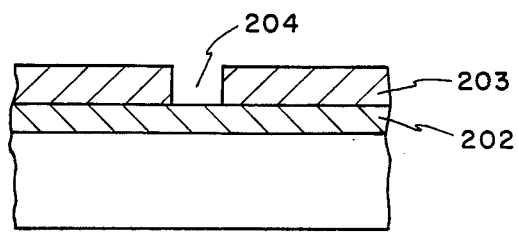
Figure 1C:
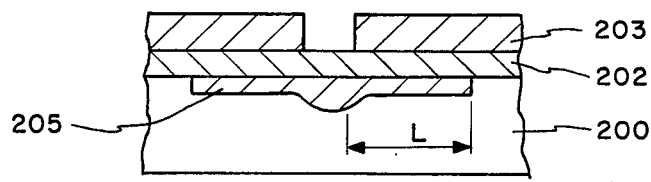

As shown in FIG. 1A, first, a molybdenum film 201 having a thickness of about 400 Å is deposited on the surface of a p-type silicon single crystal substrate 200 by sputtering. Then, a heat treatment is carried out at 600° C. to react the molybdenum film 201 and the silicon single crystal substrate 200 with each other thereby to form a molybdenum silicide film 202. Thereafter, a silicon oxide film 203 is deposited on the molybdenum silicide film 202 by chemical vapor deposition (CVD), and a heat treatment is carried out at 1000° C. to fine the silicon oxide film 203. Then, a part of the silicon oxide film 203 is etched by employing a photoetching technique to provide an opening 204 as an impurity supply opening (see FIG. 1B). Then, by carrying out a heat treatment in an atmosphere containing phosphorus, i.e., by diffusing phosphorus from the opening 204, it is possible to form a phosphorus-diffused region 205 not only in the part of the silicon substrate directly below the opening 204 but extending to a region horizontally away from the opening edge by a distance L, as shown in FIG. 1C. The diffusion distance L (see FIG. 1C) horizontally measured from the edge of the opening 204 is 90 μm when diffusion is carried out by employing phosphorus nitride ($P_3N_5$), for example, as a diffusion source at 1000° C. for 30 minutes, and is 37.5 μm when a similar diffusion is performed at 900° C. for 60 minutes.

Figure 2A:
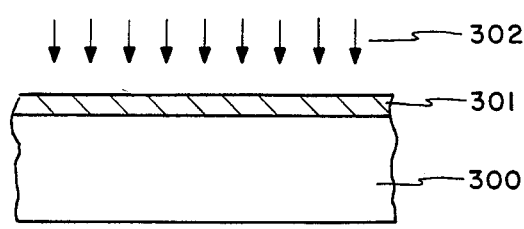
Figure 2B:
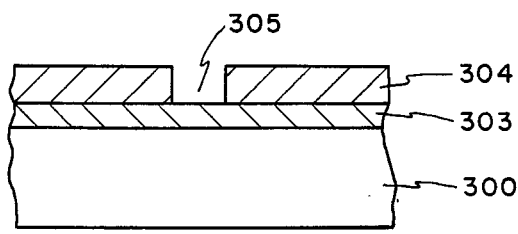
Figure 2C:
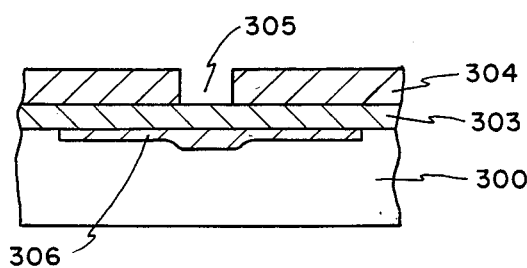

A fundamental example of the method in accordance with the invention shown in FIG. 2 illustrates a formation in which the formation of the molybdenum silicide employed in FIG. 1 is carried out by utilizing the interface mixing by ion implantation and thermal reaction. As shown in FIG. 2A, a molybdenum film 301 having a thickness of 400 Å is deposited on a p-type silicon substrate 300 by sputtering. Then, silicon (Si) ions 302 are implanted by $5 \times 10^{15}$ cm$^{-2}$ at 100 keV to mix the interface portion of the molybdenum film 301 and that of the silicon substrate 300. Thereafter, a heat treatment is carried out at 550° C. for 20 minutes to react the molybdenum film 301 and the surface of the silicon substrate 300 with each other thereby to form a molybdenum silicide ($MoSi_2$) layer 303 having a thickness of about 0.1 μm. Moreover, a silicon oxide film 304 is deposited on the molybdenum silicide layer 303 by CVD. Thereafter, a heat treatment is carried out at 1000° C. for 20 minutes in order to recover any crystal defect produced by the silicon ion implantation as well as to fine the silicon oxide film 304 formed by CVD. Subsequently, a part of the silicon oxide film 304 is etched to provide an opening 305 (see FIG. 2B). Then, by carrying out a heat treatment at 950° C. for 30 minutes in an atmosphere containing phsophorus, i.e., by diffusing phosphorus from the opening 305, it is possible to form a phosphorus-diffused layer 306 not only in the part of the silicon substrate directly below the opening 305 but also horizontally extending 60 μm from the opening edge, as shown in FIG. 2C. It is to be noted that the $MoSi_2$ film 303 formed according to this example is better in smoothness of both the surface and the interface between the same and the silicon substrate than those of the $MoSi_2$ film 202 formed only by a mere thermal reaction as shown in FIG. 1.

Although in the examples shown in FIGS. 1 and 2, the molybdenum silicide is employed, similar results have been confirmed also in the cases of polycrystalline films of other metal silicides, such as titanium silicide, tantalum silicide and tungsten silicide, or multilayer films thereof. In addition, a similar result is obtained with boron, which is a p-type impurity.

FIG. 3 shows a method of manufacturing an n-channel MOS integrated circuit to which the method in accordance with the invention is applied. The manufacturing method will be described hereinunder with reference to FIGS. 3A to 3J which schematically show the IGFET part of an MOS integrated circuit in section in principal steps, respectively. As shown in FIG. 3A, after a field oxide film 401 and a gate oxide film 402 are formed on the major surface of a p-type silicon substrate 400 by employing standard methods, respectively, a phosphorus-doped polycrystalline silicon film 403 is deposited thereon. Then, the phosphorus-doped polycrystalline silicon film 403 is patterned by employing a standard photoetching technique to form a gate electrode 404 (see FIG. 3B). Then, with the gate electrode 404 employed as a mask, the gate oxide film 402 on portions 405, 406 to be source and drain regions as well as diffused layer wirings are removed to expose the silicon surface (see FIG. 3C). Thereafter, as shown in FIG. 3D, a molybdenum film 407 having a thickness of 200 Å is deposited on the whole surface by sputtering, and moreover, silicon ions 408 are implanted by $5 \times 10^{15}$ cm$^{-2}$ with 50 keV for mixing the interface between the molybdenum film 407 on one hand and the interfacial portion of the silicon substrate 400 and that of the polycrystalline silicon gate electrode 404 on the other. In this case, in place of silicon ions, other inactive ions, such as argon ions, may be implanted to mix the interface molybdenum film and that of the silicon substrate. Then, by carrying out a heat treatment in an inert gas atmosphere at 550° C. for 20 minutes, molybdenum silicide layers 409, 409', 410 of 500 Å thickness, respectively, are formed in the regions in which source and drain regions and diffused layer wirings (not shown) are to be formed and the surface of the polycrystalline silicon gate electrode 404, respectifely, as shown in FIG. 3E. The silicide layers are embedded in the silicon substrate so as to make the surface of the silicide layers substantially coincide with that of the substrate. Subsequently, the unreacted molybdenum 407' on the field oxide film is selectively removed by employing a hydrogen peroxide solution ($H_2O_2$) (see FIG. 3F). After a phosphorus silicate glass film 411 is deposited on the whole surface by CVD as shown in FIG. 3G, an annealing is effected at 1000° C. for 20 minutes to lower the resistance of the molybdenum silicide films 409, 409' 410 and to recover any damage produced in the silicon substrate by the silicon ion implantation and to fluidize the phosphorus silicate glass film 411 thereby to transform the phosphorus silicate glass film 411 into a phosphorus silicate glass film 411' whose step portions have been smoothed (see FIG. 3H). In this case, smoothing of the step portions may be effected by: first, carrying out a heat treatment at 1000° C. in order to recover any damage produced by the ion implantation and to lower the electrical resistance of the $MoSi_2$ film; then, depositing a phosphate glass film as an interlayer insulating film by CVD; and then, carrying out a heat treatment at 950° C. to fluidize the phosphate glass. Thereafter, as shown in FIG. 3H, contact holes 412, 412' are opened in the phosphorus silicate glass film 411', and phosphorus is diffused from the contact holes 412, 412' at 900° C. for 20 minutes thereby to form extremely shallow diffused layers 413, 413' in silicon regions in contact with the molybdenum silicide layers 409, 409', respectively. Then, as shown in FIG. 3J, wiring layers 414, 414' of aluminum or an aluminum-based alloy are formed by a standard method thereby to complete the principal manufacturing steps. As a result, it is possible to realize an MOS integrated circuit employing an IGFET having an extremely smooth interlayer insulating film and, source and drain regions which have a remarkably small junction depth of about 0.1 μm, from the surface of the channel region, in the vicinity of the gate electrode end and are covered with the silicide layer. Although in this embodiment a temperature of 550° C. is employed as the temperature of the heat treatment for forming the silicide, the heat treatment temperature favorably falls between 500° and 600° C. since a temperature as high as 500° C. is required as a lowest temperature needed for forming a silicide and the upper limit within which a silicide can be formed in a self-alignment manner is 600° C. In addition, although in this embodiment, an ordinary thermal diffusion is employed as a method for horizontally diffusing a dopant through a refractory metal silicide, it is also possible to employ a phosphorus-doped polycrystalline silicon as a thermal diffusion source, and moreover, it is possible that a dopant impurity is introduced into the refractory metal silicide at the opening with a high concentration by ion implantation and is then thermally diffused. In case of employing ion implantation, a thin layer of the insulating film may be left in the opening without exposing the silicide. Moreover, by employing boron, which is of p type, as a dopant impurity, it is possible to effectively apply the method of the invention to the manufacture of a p-channel IGFET. Furthermore, as the refractory metal, it is possible to use W, Ta, Ti and so forth, besides Mo.

Figure 3A:
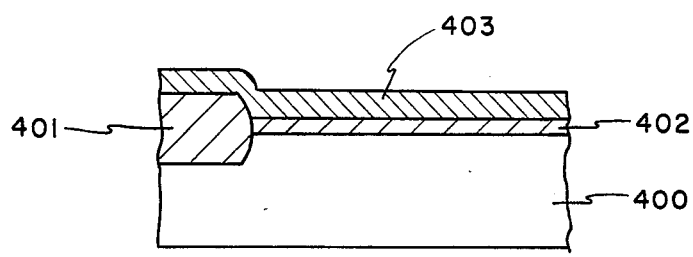
FIGS. 3A to 3J are cross-sectional views showing a first embodiment of the invention in the step order.
Figure 3B:
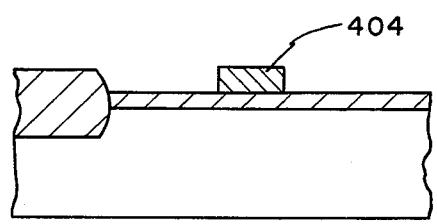
Figure 3C:
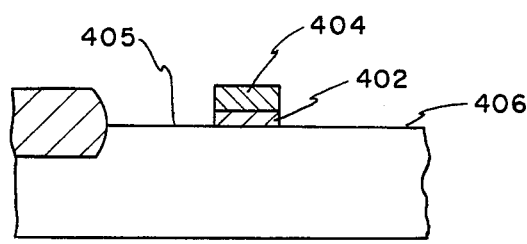
Figure 3D:
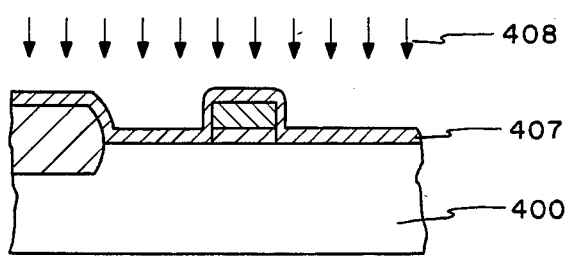
Figure 3E:
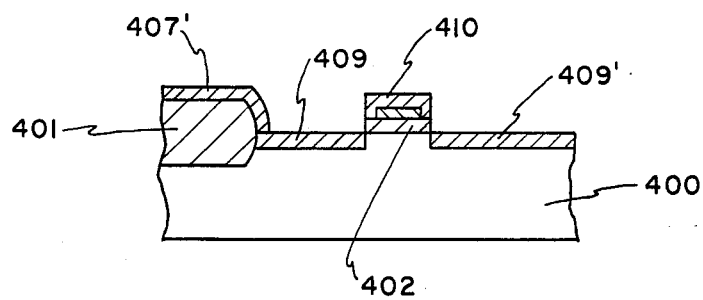
Figure 3F:
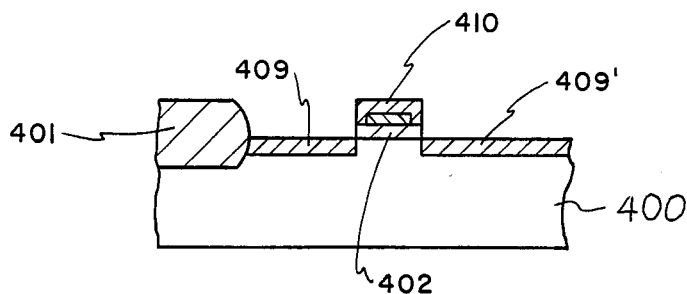
Figure 3G:
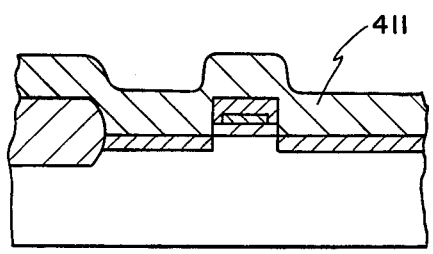
Figure 3H:
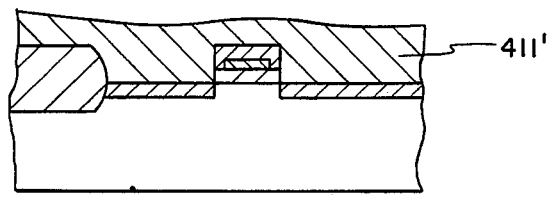
Figure 3I:
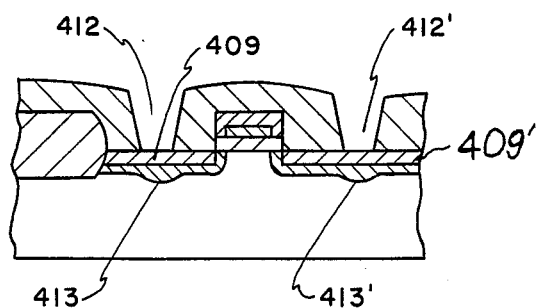
Figure 3J:
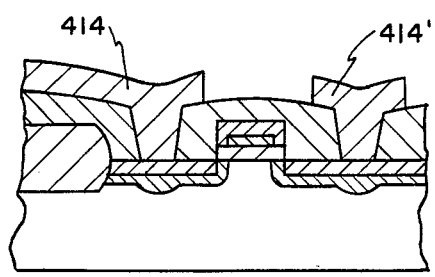
Figure 4A:
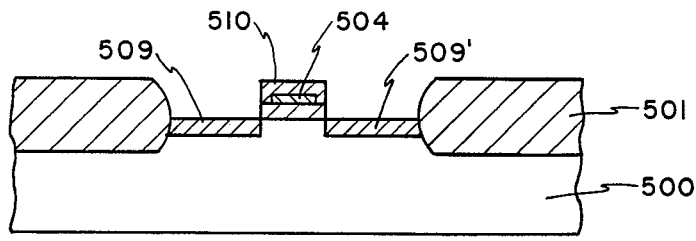
FIGS. 4A to 4F are cross-sectional views showing a second embodiment of the invention in the step order.
Figure 4B:
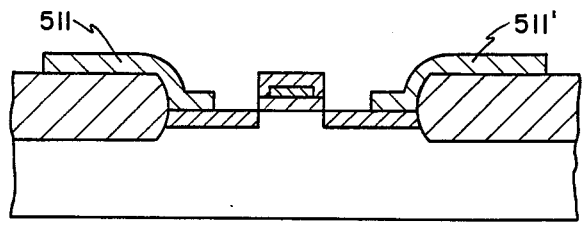
Figure 4C:
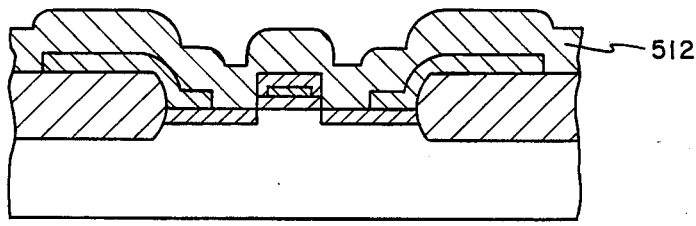
Figure 4D:
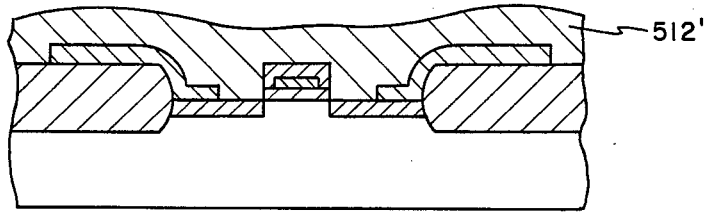
Figure 4E:
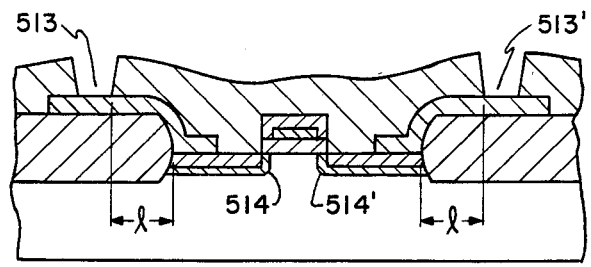
Figure 4F:
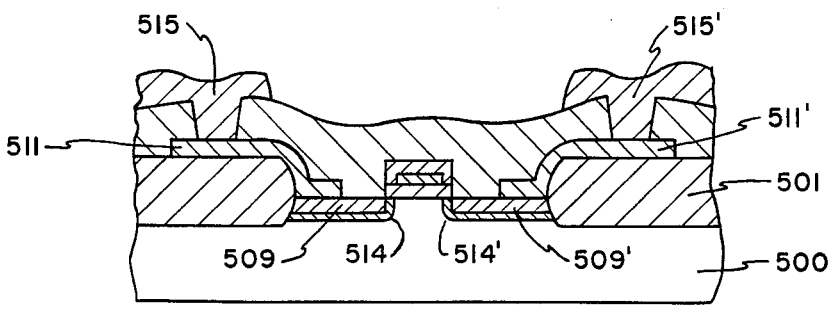

The following embodiment shown in FIG. 4 is for the case where the aluminum contacts are not directly formed on the molybdenum silicide in the source and drain regions, respectively, but are brought into ohmic contact, on the field oxide film, with molybdenum metal wirings which are in ohmic contact with the molgdenum silicide. Although the method of the invention is effective for both an n-channel IGFET and p-channel IGFET, a p-channel IGFET will be described hereinunder as an example. As shown in FIG. 4A, a structure similar to that shown in FIG. 3F is formed by employing the method described with reference to FIGS. 3A to 3E. In this embodiment, however, the polycrystalline silicon film used as a part of the gate electrode is formed by depositing a boron-doped polycrystalline silicon film. In the drawings, a reference numeral 500 denotes an n-type silicon substrate, while a numeral 504 represents a boron-doped polycrystalline silicon. In addition, numerals 509, 509' and 510 indicate molybdenum silicide layers, respectively. After the above structure is formed, a heat treatment is carried out in a nitrogen gas atmosphere at 950° C. to recover any crystal damage produced by the silicon ion implantation for mixing the interface. Then, as shown in FIG. 4B, wirings 511, 511' of polycrystalline molybdenum of 0.3 μm in thickness and 2 μm in width are formed which are in ohmic contact with the molybdenum silicide layers 509, 509' in the source and drain regions, respectively. In this case, the molybdenum film is deposited by sputtering. In addition, the etching for patterning the molybdenum film is effected by employing a potassium ferricyanide aqueous solution. Then, as an interlayer insulating film of phosphorus silicate glass 512 is deposited by CVD (see FIG. 4C). Thereafter, a heat treatment is carried out at 1000° C. for 20 minutes to fluidize the phosphorus silicate glass film 512 thereby to transform the same into a phosphorus silicate glass film 512' whose step portions have been smoothed (see FIG. 4D). Then, as shown in FIG. 4E, contact holes 513, 513' are opened for forming ohmic contacts with the molybdenum wirings on the field insulating film, respectively. Each distance 1 between the contact hole 513, 513' and the edge of the molybdenum silicide layer 509, 509' is 4 μm. By diffusing boron at 900° C. for 30 minutes from the contact holes 513, 513' through the molybdenum wirings 511, 511' and the molybdenum silicide layers 509, 509' of 4 μm length, extremely shallow boron-diffused layers 514, 514' are formed in the silicon regions in contact with the molybdenum silicide layers 509, 509', respectively. In this case, as the boron diffusion source, boron nitride (BN) is employed. Then, as shown in FIG. 4F, wiring contacts 515, 515' of aluminum or an aluminum-based alloy are formed by a standard method thereby to complete the principal manufacturing steps.

In this embodiment, the polycrystalline silicon 504 previously doped with an impurity is employed as the polycrystalline silicon 504 forming a part of the gate electrode. If a polycrystalline silicon not doped with any impurity is deposited, openings are formed in the interlayer insulating film or the gate electrode wiring portions on the field insulating film and then the method in accordance with the invention is applied, it is possible to diffuse an impurity also into the polycrystalline silicon forming a part of the gate electrode simultaneously with the formation of the diffused layers for the source and drain regions.

In the above mentioned embodiment, the wiring layers 511, 511' are made of polycrystalline molybdenum. However, these wiring layers may be made of polycrystalline silicon. In this case, the impurity concentration of polycrystalline silicon is restrained to $10^{18}$ to $10^{19}$ $cm^{-3}$ or less so that the impurity is not substantially introduced into the substrate under the high temperature treatment for the fluidization of the phosphosilicate glass film. The wiring layer of the polycrystalline silicon has 0.5 μm thickness and 2 μm width. The distance 1 between the contact hole and the edge of the silicide is 4 μm, and the length of the silicide is also 4 μm. Then, the impurity is introduced from holes 513, 513', amd source and drain regions 514, 514' may be formed under the same conditions as that of polycrystalline molybdenum wiring.

Although all the above embodiments employ a standard vapor-phase diffusion as the impurity diffusing method, it is obvious that the advantages of the method in accordance with the invention will not be impaired by adopting a solid-phase diffusion employing as a diffusion source a polycrystalline silicon or oxide film highly doped with an impurity or such a method as introducing an impurity through the openings by means of ion implantation.

Figure 5A:
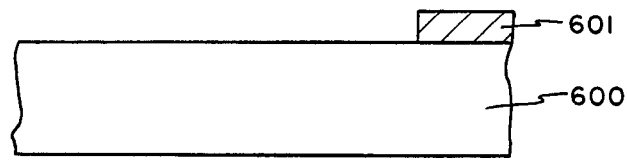
FIGS. 5A to 5E are cross-sectional views showing a third embodiment of the invention in the step order, in which FIG. 5B' is a cross-sectional view showing a modification of the step shown in FIG. 5B.
Figure 5B:
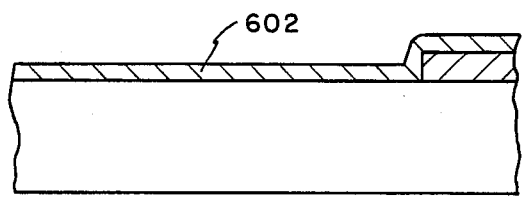
Figure 5C:
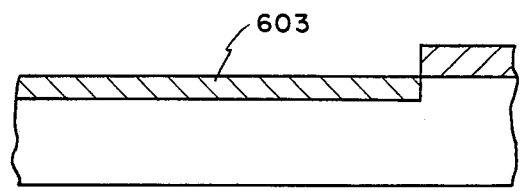
Figure 5D:
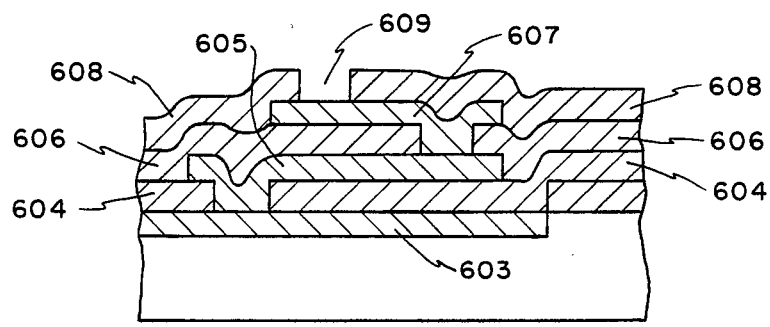
Figure 5E:
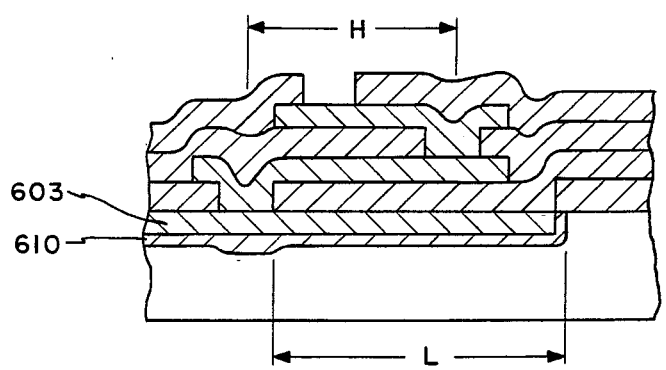
Figure 5B:
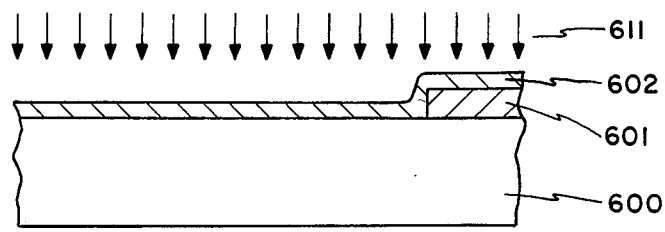

According to the next embodiment of the invention, the method comprises the steps of: forming a refractory metal silicide layer on a silicon semiconductor substrate; forming thereon a multiple layers of wiring made of a polycrystalline electrically-conductive material such as polycrystalline molybdenum or the like; and introducing an impurity from the uppermost wiring layer to form diffused region in the silicon substrate around the refractory metal silicide layer. First of all, as shown in FIG. 5A, a silicon oxide pattern 601 having a thickness of about 0.5 μm is formed on the surface of a p-type single crystal silicon substrate 600 by employing ordinary thermal oxidation and photoetching techniques. Then, a molybdenum film 602 is deposited thereon to a thickness of about 0.04 μm by sputtering or the like, as shown in FIG. 5B. Moreover, a heat treatment is carried out at around 600° C. to react the contact portions of both the molybdenum film 602 and the silicon substrate 600 with each other to form a mulybdenum silicide pattern 603 having a thickness of about 0.1 μm. In this case, in place of the alloying reaction between the molybdenum film 602 and the silicon 600 by a mere heat treatment employed as a formation of the molybdenum silicide pattern 603, it is possible to employ such a method that the heat treatment is carried out after the interfacial portions of both the molybdenum film and the silicon are atomically mixed together. More specifically, as shown in FIG. 5B', after the silicon oxide pattern 601 is formed on the surface of the p-type silicon single crystal substrate 600, the molybdenum thin film 602 having a thickness of 400 Å is deposited thereon by sputtering. Then, silicon ions 611 may be implanted by $5 \times 10^{15}$ cm$^{-2}$ with such an energy that the range reaches the vicinity of the interface between the molybdenum thin film 602 and the silicon substrate 600 (100 keV in this case), thereby to mix the interfacial portions of both the molybdenum thin film 602 and the silicon substrate 600. Then, a heat treatment is carried out at 500° C. for 20 minutes to form the molybdenum silicide. Moreover, the unreacted molybdenum left on the field silicon oxide pattern 601 is selectively removed by means of a hydrogen peroxide solution (see FIG. 5C). Then, as shown in FIG. 5D, a silicon oxide film 604 having a thickness 0.5 μm is deposited by an ordinary CVD method, and a contact hole is opened by photoetching. Thereafter, polycrystalline molybdenum film having a thickness of 0.3 μm is deposited thereon by sputtering or the like from a molybdenum silicide (MoSi$_2$) target, and a polycrystalline molybdenum wiring 605 and an interlayer insulating film 604 employing a silicon oxide are formed by photoetching. Moreover, by repeating these steps, a polycrystalline molybdenum wiring 607 and interlayer insulating films 606, 608 are formed. The insulating films 604, 606, 608 may be formed by C V D process at about 430° C. Thereafter, a heat treatment is carried out in a nitrogen gas atmosphere at 1000° C. for one hour to fine the silicon oxide interlayer insulating films 604, 606, 608 and lower the resistance of the molybdenum silicide 603 and the policrystalline molybdenum wirings 605, 607. Further, an opening 609 is provided by photoetching. As a result, it is possible to obtain a multilayer wiring structure (see FIG. 5D) that the surface of the polycrystalline molybdenum wiring 607 exposed in the opening 609 is electrically connected to the molybdenum silicide pattern 603 formed in the silicon substrate surface through another layer of the polycrystalline molybdenum wiring 605. Then, by placing this structure in a phosphorus diffusing atmosphere having phosphorus nitride as a diffusion source at 900° C. for one hour, phosphorus is diffused or transported into the molybdenum silicide pattern 603 through the polycrystalline molybdenum wirings 607, 605 from the opening 609 used as a phosphorus supply opening, or while being diffused or transported, the phosphorus is diffused in the silicon region adjacent to the molybdenum silicide pattern 603 from the same. As a result, it is possible to form a diffused layer 610 (see FIG. 5E). The diffusion depth of the phosphorus measured from the interface between the molybdenum silicide pattern 603 and the silicon substrate is possible to make small, about 0.1 μm, in the region apart from the contact hole portion. Moreover, in this embodiment, the distance H between the contact holes for the polycrystalline molybdenum wirings 605, 607, respectively, is 20 μm, and the diffused layer 610 formed in the silicon surface region extends to the end portion of the silicide pattern 603 extending 25 μm from the edge of the contact hole. Thus, it is possible to realize a horizontal diffusion L, which is more than 25 μm long. Although in this embodiment, polycrystalline molybdenum is employed as the polycrystalline electrically-conductive material for the multilayer wiring continuous a similar effect has been confirmed with polycrystalline of other metals, such as titanium, tantalum and tungsten, and also with polycrystalline silicon.

As the silicon to form a pn junction, the silicon substrate is not exclusive and it is possible to obtain a similar result even if a monocrystalline or polycrystalline thin film formed on an insulating film on a semiconductor body, for example, is employed.

Moreover, although in this embodiment the wiring constituted by two layers is formed and the impurity is diffused from the uppermost layer, it is possible to form more layers for wiring, e.g., three or more layers, and diffuse an impurity from the uppermost layer thereof.

Further, with boron, which is a p-type impurity with respect to silicon, it is possible to obtain an effect equal to that in the case of phosphorus by employing a boron nitride diffusion source or the like. Furthermore, it is obvious that, besides a standard vapor-phase diffusion, it is possible to employ as a diffusion source a polycrystalline silicon or oxide film highly doped with an impurity by depositing the same over the region including the opening, or a diffusion source formed by adding an impurity to the polycrystalline wiring as an impurity transporting path through ion implantation or depositing a polycrystalline electrically-conductive thin film doped with an impurity.

In the embodiments described above, the step of introducing an impurity in a refractory metal silicide layer and the step of diffusing the impurity into a silicon semiconductor from the refractory metal silicide layer to form a diffused region in a silicon substrate, are carried out in the same mutual step at the same temperature. In this case, as shown in FIGS. 1, 2, 3 and 5, the portion of the diffused regions underneath the opening in the insulating layer is formed a little deeper than the other portions.

Accordingly, the following embodiment is provided in order to make the depth of the diffused region practically uniform. More specifically, first, an impurity, such as phosphorus and boron, is introduced through an opening in an insulating layer which is provided on the silicide layer only into the refractory metal silicide layer at a low temperature, below 800° C. In this step, the impurity is substantially uniformly distributed throughout the refractory metal silicide layer but is not substantially diffused into the silicon substrate. Then, after the removal of an impurity source which has been employed to introduce the impurity into the refractory metal silicide layer through the opening, a heat treatment is carried out an atmosphere containing an inert gas, such as N$_2$ gas and the like, at a temperature higher than 900° C. Thus, the impurity is diffused into the silicon substrate from the refractory metal silicide layer as a diffusion source, and it is possible to obtain a diffused region having a depth or bottom surface which is substantially flat.

This embodiment will be described hereinunder with reference to FIG. 6.

Figure 6A:
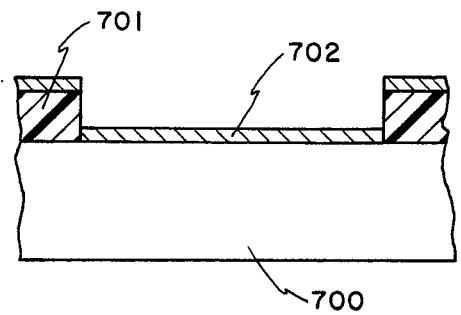
FIGS. 6A to 6D are cross-sectional views showing a fourth embodiment of the invention in the step order.
Figure 6B:
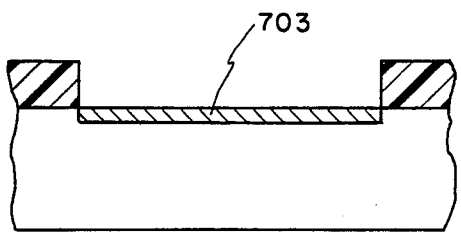
Figure 6C:
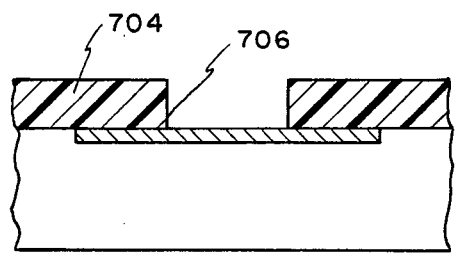
Figure 6D:
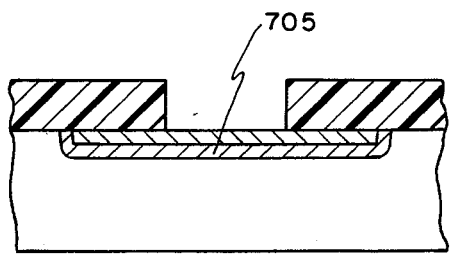

As shown in FIG. 6A, after a mask 701 of silicon oxide film having a thickness of about 5000 Å is formed on the surface of a p-type silicon single crystal substrate 700, a molybdenum film 702 having a thickness of about 400 Å is deposited thereon by sputtering. Then, Si ions are implanted by $5 \times 10^{15}$ cm$^{-2}$ with 100 keV to mix the interfacial portions of both the molybdenum film 702 and the silicon substrate 700. Thereafter, a heat treatment is carried out at 550° C. for 20 minutes to react the surface layers of both the molybdenum film 702 and the silicon substrate 700 thereby to form a molybdenum silicide ($MoSi_2$) film 703 having a thickness of about 0.1 μm. Then, the unreacted molybdenum on the silicon oxide film is selectively etched by a hydrogen peroxide solution ($H_2O_2$) aqueous solution thereby to form a molybdenum silicide layer 703 made of molybdenum silicide in a portion of the surface of the semiconductor substrate 700 as shown in FIG. 6B. It is to be noted that the molybdenum silicide film formed in this embodiment is better in smoothness of both the surface and the interface between the same and the silicon substrate as well as self-alignment properties thereof with the silicon pattern than the molybdenum silicide film formed only by a mere heat treatment at about 550° C. and therefore is extremely effective in application to an electrode or wiring of a semiconductor device. Then, as shown in FIG. 6C, after the silicon oxide film 701 is removed by an HF aqueous solution, a silicon oxide film 704 having a thickness of about 5500 Å is newly formed by vapor growth. After a heat treatment at 950° C. is carried out for fining the silicon oxide film 704, an opening 706 is provided by employing an ordinary photoetching technique. Then, a diffusion is effected in a gas atmosphere containing phosphorus oxychloride ($PoCl_3$) at 800° C. for one hour to diffuse phosphorus into the molybdenum silicide film 703 through the opening 706. After the phosphorus silicate glass layer formed on the silicide surface in the opening during the diffusion step, is removed by an HF aqueous solution, a heat treatment is carried out in an $N_2$ gas atmosphere at 1000° C. for 20 minutes to diffuse the phosphorus into the surface of the semiconductor substrate 700 from the molybdenum silicide film thereby to form a diffused layer 705. The obtained diffused layer has a horizontal diffusion distance of more than 200 μm and is satisfactorily shallow, having a depth of about 0.3 μm, which is uniform. In addition, a similar result can be obtained if phosphorus is diffused by employing a diffusion source of a solid substance containing phosphorus. Moreover, in the above embodiment, if after phosphorus is diffused into the molybdenum silicide a heat treatment is carried out at a temperature of 900° to 950° C., it is possible to form a diffused layer having a shallower junction, 0.1 to 0.2 μm in depth. Further, although in the above embodiment, the molybdenum silicide film is employed as the polycrystalline alloy layer, similar results have been confirmed also in the case of other silicide films such as $WSi_2$, $TaSi_2$ and $TiSi_2$. However, in the case of the $TiSi_2$ film, the phosphorus silicate glass layer is removed by dry etching. Furthermore, similar results can be obtained also in the case where a double-layer film constituted by $MoSi_2$ and $TiSi_2$ is employed as the polycrystalline alloy layer. Although in the above embodiment the p-type semiconductor substrate and phosphorus are employed as a semiconductor substrate and an impurity to be diffused, respectively, it is possible to obtain a result similar to that in this embodiment if an n-type semiconductor substrate and boron are employed as a semiconductor substrate and an impurity to be diffused, respectively, under the following forming conditions. More specifically, after a diffusion is effected in a gas atmosphere containing boron chloride ($BCl_3$) at 750° C. for one hour, a heat treatment is carried out in an $N_2$ gas atmosphere at 900° C. for 20 minutes. Thus, a diffused layer is formed which is shallow, 0.2 μm in depth, and has a uniform bottom surface. In addition, the method in accordance with this embodiment is similarly effective if a solid substance containing boron is employed as a diffusion source and a $WSi_2$, $TaSi_2$ or $TiSi_2$ film is employed as a polycrystalline alloy film.

What is claimed is:

1. A method of manufacturing a semiconductor device comprising the steps of forming a refractory metal silicide film on a limited area of a major surface of a silicon substrate of one conductivity type, forming an insulating film to cover said silicide film, forming an opening with an area smaller than the area of said silicide film by selectively removing said insulating film on a portion of said silicide layer, diffusing an impurity of the opposite conductivity type from the portion of said silicide which is exposed by said opening, said diffusion extending laterally into the entire area of said silicide film and into a portion of said substrate in contact with said silicide film to form a diffused region of said opposite conductivity type in said substrate.

2. A method of manufacturing a semiconductor device of claim 1, in which said refractory metal silicide film is embedded from the surface of said semiconductor substrate by 0.05 to 0.2 μm.

3. A method of manufacturing of a semiconductor device of claim 1, in which the distance between the bottom or the side of said refractory metal silicide film and the PN junction formed between said diffused region and said silicon substrate ranges from 0.05 to 0.2 μm.

4. A method of manufacturing a semiconductor device comprising the steps of forming a refractory metal film on a major surface of a partially exposed silicon substrate, implanting inactive ions into the interface between said refractory metal film and the surface of said silicon substrate to mix the interfacial portion of both said refractory metal film and silicon substrate; carrying out a heat treatment to react said refractory metal film and silicon with each other at a region where said refractory metal film makes contact with the surface of said silicon substrate to form a refractory metal silicide layer; removing the unreacted refractory metal film; forming an insulating film to cover said silicide layer; forming an opening with an area which is smaller than the area of said silicide layer by removing said insulating film on a portion of said silicide layer to expose said portion of said silicide layer; diffusing an impurity of the opposite conductivity type from said portion of said silicide layer which is exposed by said opening, said diffusion extending laterally into said silicide layer; and diffusing said impurity from said silicide layer vertically into said silicon substrate.

5. A method of manufacturing a semiconductor device comprising the steps of: selectively forming a field insulating film on a silicon substrate; forming a refractory metal silicide layer in a predetermined portion in an element-forming region of said silicon substrate adjacent to said field insulating film; forming a wiring layer of polycrystalline electrically-conductive material extending on said field insulating film and in contact with said refractory metal silicide; forming an insulating layer to cover both said refractory metal silicide layer and said wiring layer; forming in said insulating layer a hole reaching the surface of a predetermined portion of said wiring layer on said field insulating film; supplying impurities to said refractory metal silicide layer from said hole through said first wiring layer; and introducing said impurity into the portion of said silicon semiconductor substrate which is adjacent to said refractory metal silicide layer to form a diffused region under said refractory metal silicide layer in said silicon substrate.

6. A method of manufacturing a semiconductor device of claim 5, in which said polycrystalline electrically-conductive material is polycrystalline molybdenum.

7. A method of manufacturing a semiconductor device of claim 5, in which said polycrystalline electrically-conductive material is polycrystalline silicon.

8. A method of manufacturing a semiconductor device comprising the step of: selectively forming a field insulating film on a silicon substrate; forming a refractory metal silicide layer on a predetermined portion of an element-forming region of said silicon substrate adjacent to said field insulating film; forming a first insulating film on said silicide layer; opening a first contact hole in said first insulating film on a contact portion of said silicide layer; forming a first wiring layer of polycrystalline electrically-conductive material extending on said first insulating film and in contact with said silicide layer through said first contact hole; forming a second insulating film on said first wiring layer; opening a second contact hole in said second insulating film on a contact portion of said first wiring layer; forming a second wiring layer of polycrystalline electrically-conductive material connected to said first wiring layer through said second contact hole and extending on said second insulating film; introducing a dopant impurity from at least a surface portion of said second wiring layer to said silicide layer through said first wiring layer, whereby said impurity is diffused laterally in said silicide layer and is diffused from said silicide layer to said silicon substrate to form a diffused region under said silicide layer in said silicon substrate.

9. A method of manufacturing a semiconductor device comprising the steps of forming a first insulating layer on a major surface of a silicon substrate of one conductivity type, forming a first opening in said first insulating layer, forming a refractory metal film on said first insulating layer and in said first opening, reacting said refractory metal film and said silicon substrate with each other in said first opening to form a refractory metal silicide layer on a limited area of the major surface of said silicon substrate, forming a second insulating layer to cover said silicide layer, forming a second opening with an area smaller than the area of said silicide layer in said second insulating layer by removing a part of said second insulating layer on a portion of said silicide layer, supplying an impurity of the opposite conductivity type from said second opening to said silicide layer and diffusing said impurity from said silicide layer into said substrate to form a diffused region of said opposite conductivity type at a portion in contact with said silicide layer in said substrate.

10. A method of manufacturing a semiconductor device of claim 9, further comprising a step of, before reacting said refractory metal film and said silicon substrate, implanting inactive ions into the interface between said refractory metal film and said silicon substrate.

11. A method of manufacturing the semiconductor device of claim 9, in which said impurity is diffused at first from said second opening laterally to said silicide layer at the temperature below 800° C., and thereafter, said impurity is diffused from said silicide layer vertically into said semiconductor substrate at the temperature above 900° C.

* * * * *